(12) United States Patent
Franca-Neto

(10) Patent No.: US 6,707,343 B2
(45) Date of Patent: Mar. 16, 2004

(54) FREQUENCY SYNTHESIS APPARATUS, SYSTEMS, AND METHODS

(75) Inventor: Luiz M. Franca-Neto, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/438,081

(22) Filed: May 14, 2003

(65) Prior Publication Data
US 2003/0199253 A1 Oct. 23, 2003

Related U.S. Application Data

(63) Continuation of application No. 09/918,987, filed on Jul. 31, 2001, now Pat. No. 6,608,529.

(51) Int. Cl.[7] .................................................. A03L 7/18
(52) U.S. Cl. .......................... 331/18; 331/100; 331/1 R
(58) Field of Search .................................... 331/100, 18

(56) References Cited

U.S. PATENT DOCUMENTS

| | | | |
|---|---|---|---|
| 4,931,748 A | | 6/1990 | McDermott et al. ........... 331/18 |
| 5,550,515 A | | 8/1996 | Liang et al. .................... 331/18 |
| 5,572,168 A | | 11/1996 | Kasturia ........................ 331/18 |
| 5,673,007 A | * | 9/1997 | Kirisawa ....................... 331/18 |
| 5,692,023 A | | 11/1997 | Clark ............................ 331/18 |
| 5,801,589 A | * | 9/1998 | Tajima et al. .................. 331/18 |
| 5,847,615 A | * | 12/1998 | Roth ............................. 331/18 |
| 6,066,989 A | * | 5/2000 | Knecht et al. ................. 331/18 |
| 6,229,399 B1 | * | 5/2001 | Tobise et al. .................. 331/18 |
| 6,236,275 B1 | * | 5/2001 | Dent .............................. 331/18 |
| 6,239,660 B1 | * | 5/2001 | Dekker .......................... 331/18 |
| 6,249,189 B1 | * | 6/2001 | Wu et al. ....................... 331/18 |
| 6,608,529 B2 | * | 8/2003 | Franca-Neto ................ 331/100 |

* cited by examiner

Primary Examiner—Michael Tokar
Assistant Examiner—Lam T. Mai
(74) Attorney, Agent, or Firm—Schwegman, Lundberg, Woessner & Kluth, P.A.

(57) ABSTRACT

A frequency synthesizer, a multi-channel carrier generator, and a transceiver, as well as a method for generating a sub-carrier frequency are described.

29 Claims, 4 Drawing Sheets

FREQUENCY SYNTHESIS APPARATUS, SYSTEMS, AND METHODS

RELATED PATENTS

This application is a continuation of U.S. patent application Ser. No. 09/918,987, filed Jul. 31, 2001 is now a U.S. Pat. No. 6,608,529, which is incorporated herein by reference.

This application is related to co-pending application Ser. No. 09/896,345, filed on Jun. 28, 2001, and 10/118,116 filed Apr. 8, 2002, entitled "Area Efficient Waveform Evaluation and DC Offset Cancellation Circuits", which are commonly assigned to the assignee of the present application.

TECHNICAL FIELD

Embodiments of the present invention relate generally to frequency generation, synthesis, and processing.

BACKGROUND INFORMATION

Modern communications equipment design relies on the generation of various periodic output frequencies. While oscillators are preferred for their overall stability and purity, individual oscillators differ, and the issues of amplitude stability and spectral purity are ever-present. Moreover, while stable oscillators built with high-Q crystals often exhibit excellent spectral purity, such oscillators can usually only be tuned over a range of several hundred parts per million. Since most communications equipment must operate at a number of different frequencies spanning a considerably larger range, and because it is usually not economical to fabricate separate oscillators for each frequency to be generated, frequency synthesizers are widely used in modern communications circuit design. Given their advantages, synthesizers are thus often used as the core of multi-channel communications circuit design. However, the low-pass control loop filters used in phase-locked loop (PLL)-based synthesizers often require a large resistance-capacitance (RC) time constant (which implies large values of resistance and capacitance) to provide proper control signals for the voltage-controlled oscillator (VCO) which is also part of the PLL circuit. These loop filters thus require large amounts of circuit surface area and power to operate.

The ability to provide many channels for communication, along with full usage of individual channel capacity, is often a major goal for the communications circuit designer. More and more channels are required to support the public demand for instant contact with others as the use of personal communications devices becomes more popular. Those skilled in the art also know that the capability to effect multi-channel communications provides a robust and scalable mechanism for circuit designs to achieve the goal of effectively utilizing all available channels. Increasing the data transmission rate may serve to enlarge the number of channels and increase bandwidth availability. On the other hand, the occurrence of one or more notches within a band of frequencies or even within a single communications channel (perhaps caused by destructive interference, resonant inter-circuit connectors, etc.) can reduce the availability of channels.

Conventional discrete time domain-based design approaches do not lend themselves to high data rate communications. And, as mentioned above, circuit designers are also concerned with the amount of circuit real estate and power required by conventional PLL-based multi-frequency solutions. Thus, there is a need in the art to increase the number of channels available for stable, low-jitter communication, along with reducing dependence on conventional high-area, high-power designs.

DETAILED DESCRIPTION

Figure 1:
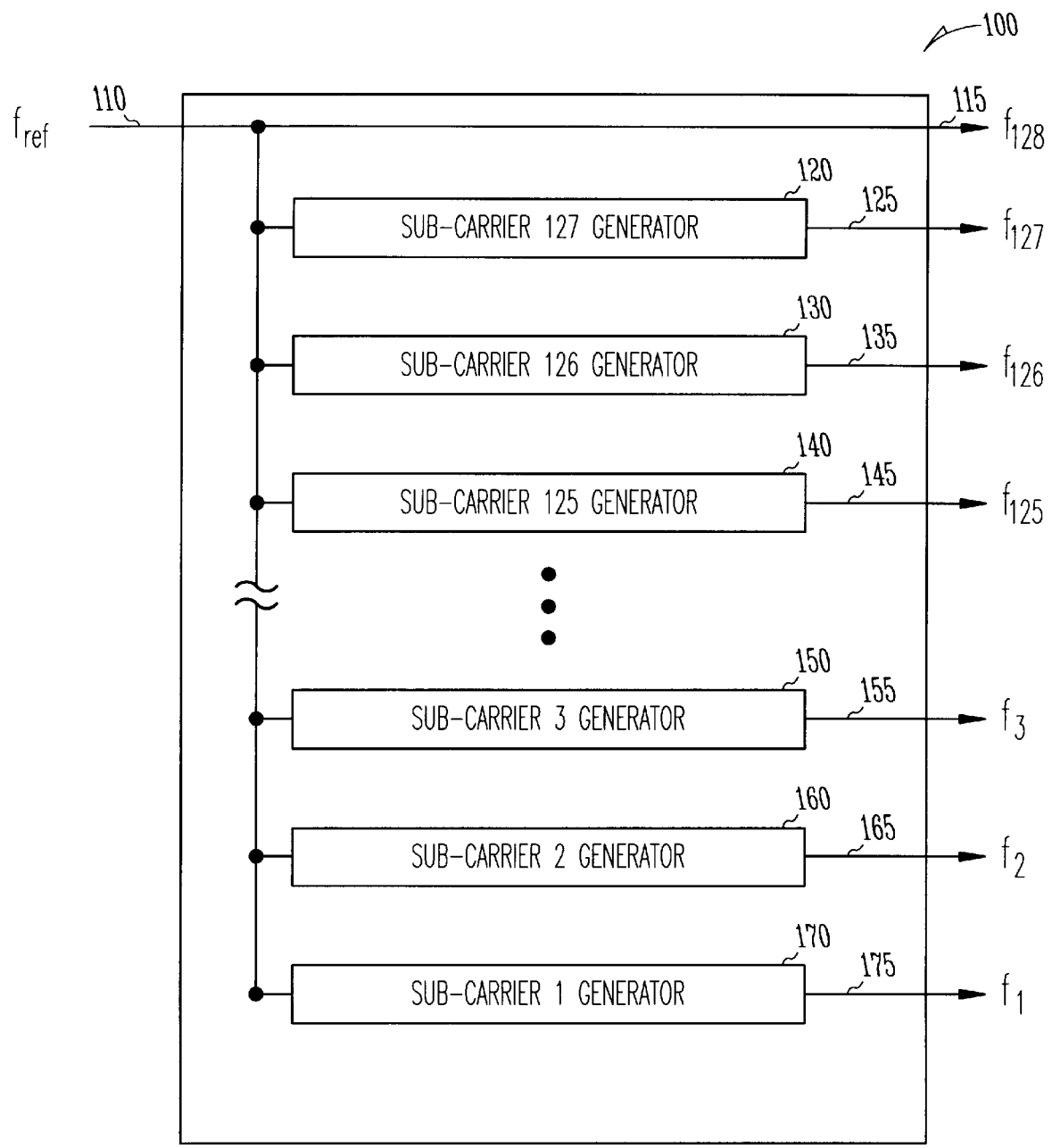
FIG. 1 is a schematic block diagram of a multi-frequency carrier generator according to various embodiments.

In the following detailed description of various embodiments, reference is made to the accompanying drawings that form a part hereof, and in which are shown by way of illustration, and not of limitation, specific embodiments in which the material disclosed may be practiced. In the drawings, like numerals describe substantially similar components throughout the several views. The embodiments illustrated are described in sufficient detail to enable those skilled in the art to practice them. Other embodiments may be utilized and derived therefrom, such that structural, logical, and electrical circuit substitutions and changes may be made without departing from the scope of the invention. The following detailed description, therefore, is not to be taken in a limiting sense, and the scope of the various embodiments is defined only by the appended claims, along with the full range of equivalents to which such claims are entitled.

According to an embodiment, a sub-carrier frequency synthesizer produces a generated frequency related to a reference input frequency by a ratio of (M+1)/(N+1) using two directly-connected, sequential chains of flip-flops. The first chain of N flip-flops receives the reference frequency as an input and provides a clocked output. The second chain of M flip-flops receives the generated frequency as an input and provides a clocked output. The synthesizer also includes a duty-cycle recovery circuit coupled to the clocked outputs of the first and second flip-flop chains, and a frequency-update module coupled to the duty-cycle recovery circuit. A sub-threshold low-pass filter in the frequency-update module feeds a voltage-controlled oscillator, which provides, in turn, the generated frequency as an input to the second chain of M flip-flops, and as a sub-carrier frequency output.

Since the two chains of flip-flops are each directly connected, with no intervening logic elements, very high reference frequencies can be accommodated. Also, since the sub-threshold low-pass filter can be realized using CMOS technology, the frequency-update module can be fabricated in a manner that requires less circuit real estate than conventional loop filters, as well as less power. Thus, while more flip-flops may be required to implement some embodiments, the additional circuit real-estate required is more than offset by the area savings due to the use of sub-threshold low pass filters (described in detail below), such that the total area required is often less than that needed for much slower PLL designs. Further savings in area can be realized by implementing simple division of higher frequencies that have already been synthesized, obviating the need for unnecessary flip-flop chain circuits.

Various embodiments also take advantage of scalable design, and thus, throughout the balance of this document, it should be noted that several embodiments may be based on the following four observations: 1) fractional division of the maximum reference frequency available may be accomplished using sequential circuits; 2) the maximum operational frequency for a given circuit is obtained by minimizing combinational logic; 3) any amount of division applied to two frequencies related by a ratio of $F_x/F_{ref}=p/q$ will result in two new frequencies, also related by the same ratio p/q; and 4) a circuit conducting p operations at a frequency of $F_x$ will finish at the same time as the identical circuit conducting q operations at a frequency of $F_{ref}$.

FIG. 1 is a schematic block diagram of a multi-frequency carrier generator constructed according to various embodiments. The multi-frequency, or multi-channel carrier generator 100 includes a plurality of sub-carrier frequency synthesizers 120, 130, 140, 150, 160, and 170. As shown in FIG. 1, the reference frequency provided for the multi-channel carrier generator 100, $f_{ref}$, is provided to a common reference frequency input 110 for each one of the sub-carrier frequency synthesizers 120, 130, 140, 150, 160, and 170. If the number of channels is 128, for example, then the generated output, or sub-carrier frequencies 115 (no sub-carrier frequency synthesizer is required), 125, 135, 145, ..., 155, 165, and 175 are related to the reference frequency by a ratio of $(128/128)*f_{ref}$, $(127/128)*f_{ref}$, $(126/128)*f_{ref}$, $(125/128)*f_{ref}$, ..., $(3/128)*f_{ref}$, $(2/128)*f_{ref}$, and $(1/128)*f_{ref}$, respectively, as will be described below. If the multi-channel carrier generator 100 is fabricated using CMOS technology, then it should be assumed that the reference frequency $f_{ref}$ is less than the maximum ringing frequency of the technology, and that the sub-carrier frequencies 115, 125, 135, ..., 155, 165, and 175 are separated by a frequency distance of $f_{ref}/128$.

Figure 2:
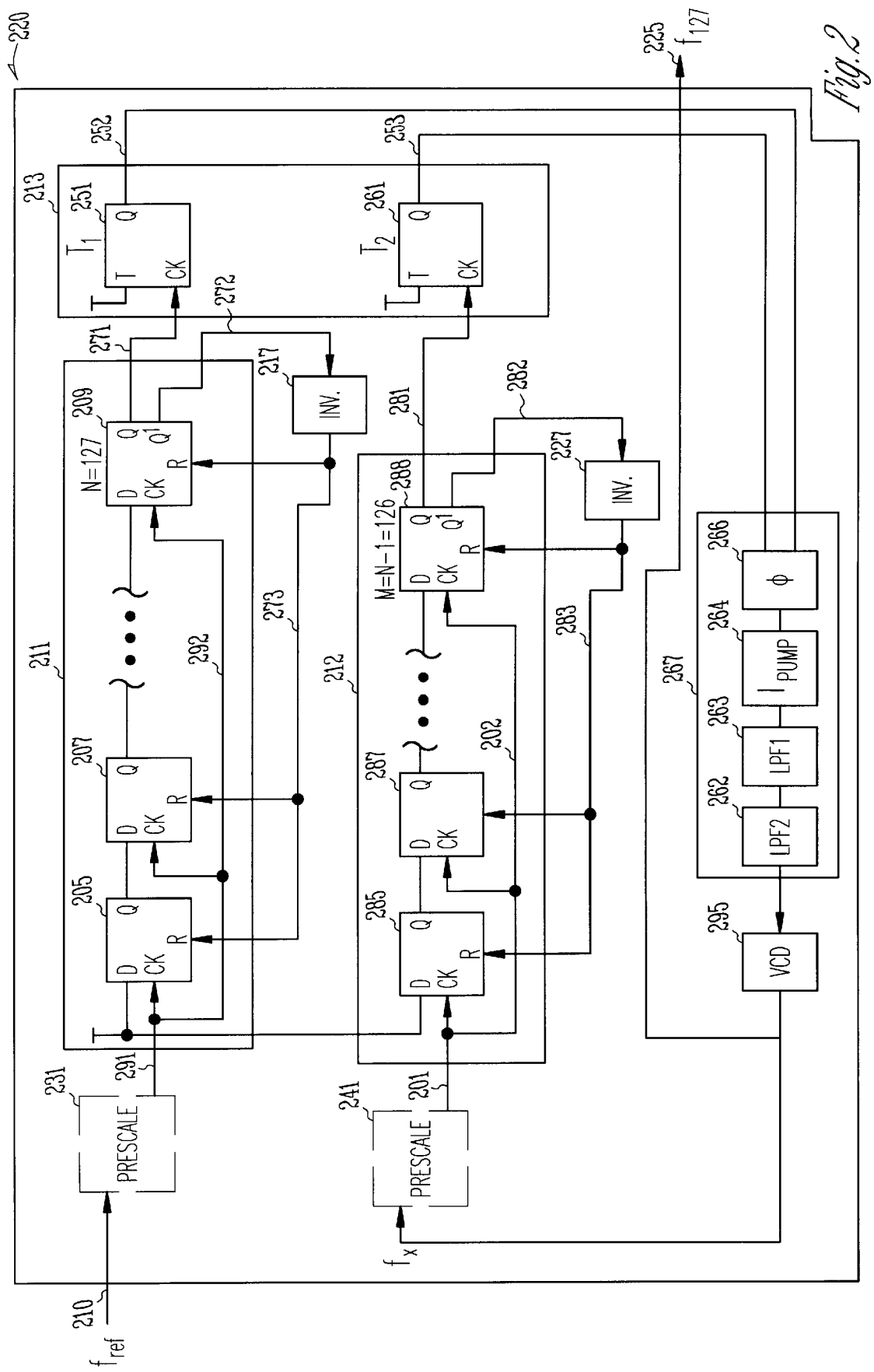
FIG. 2 is a schematic block diagram of a sub-carrier frequency synthesizer used in the multi-frequency carrier generator of FIG. 1, according to various embodiments.

FIG. 2 is a schematic block diagram of a single frequency synthesizer, of which a plurality might be used in the multi-frequency carrier generator of FIG. 1, constructed according to various embodiments. The frequency synthesizer 220 is similar to or identical to the sub-carrier frequency synthesizers 120, 130, 140, 150, 160, and 170 shown in FIG. 1.

The sub-carrier frequency synthesizer 220 includes a first directly-connected sequential chain of N flip-flops 211 which have a reference frequency input 291 and a clocked output 271. The synthesizer 220 also includes a second directly-connected sequential chain of M flip-flops 212 which have a generated frequency input 201 and a clocked output 281, with a duty-cycle recovery circuit 213 coupled to the clocked outputs 271, 281 of the first and second sequential chains of flip-flops 211, 212, respectively.

Also included in the synthesizer 220 is a frequency-update module 267 having a reference signal input 252 and a comparison signal input 253 coupled to the duty-cycle recovery circuit 213. The frequency-update module 267 typically includes a phase detector 266, a current pump 264, an (optional) pre-filter or primary low-pass filter 263, and a sub-threshold low-pass filter, or secondary low-pass filter 262. Finally, an oscillator 295, such as a voltage-controlled oscillator, is coupled to the sub-threshold low-pass filter 262, providing the generated sub-carrier frequency 225 as a feedback input (via an optional prescaler module 241) to the generated frequency input 201 of the second directly-connected sequential chain of M flip-flops 212, and as a sub-carrier generated output 225 from the synthesizer 220.

Each flip-flop 205, 207, ..., 209 of the chain 211 is clocked at a clock input CK at the reference frequency input 291. The optional prescaler module 231 provides a frequency division function between the true reference frequency input 210 and the first chain 211 reference frequency input 291 to provide a reduced frequency clocking signal 292. The prescaler module 231 can thus be used to guarantee that the first chain 211 will have sufficient time to reset during the cyclic period of the reference clocking frequency, in this case, $f_{ref}$. In addition, the prescaler module 231 can provide a frequency division function, such as a divide-by-two function, to scale down the reference frequency $f_{ref}$ by half, so as to provide a lower reference frequency which can be used to clock the flip flops 205, 207, ..., 209 in the chain 211. In essence, the prescaler module 231 divides the higher frequency down to a usable fraction, as determined by the technology used to fabricate the synthesizer flip-flop chain 211. It should be noted that, in addition to using the prescaler module 231 to accommodate higher reference frequencies $f_{ref}$, the oscillator 295 can also be designed using inductive-capacitive (LC) circuits, instead of a ringing oscillator topology.

In this example, where 128 channels are present, one hundred and twenty-seven flip-flops are used in the first chain 211; that is N=127 in this case, and the numeric reference sequence 205, 207, ..., 209 refers to all N=127 flip-flops in the first chain 211. Each flip-flop 205, 207, ..., 209 of the chain 211 may be a D-type flip-flop, which can be reset using the inverted output Q' 272 from the last (i.e., $127^{th}$) flip-flop 209 in the first chain 211. This is typically accomplished by using an inverter 217 to couple the inverted output Q' 272 to each of the reset inputs R of the flip-flops 205, 207, ..., 209 in the first chain 211.

The first flip-flop 205 of the first chain 211 has a data input D perpetually held at a logic HIGH or "1" level. Each flip-flop 207, ..., 209 of first chain 211 except the first flip-flop 205 (i.e., the second flip-flop 207 through the $127^{th}$ flip-flop 209) has a data input D coupled to the data output Q of an immediately preceding flip-flop in the chain (e.g. the data input D of the second flip-flop 207 is coupled to the data output Q of the first flip-flop 205, the data input D of the third flip-flop (not shown) is coupled to the data output Q of the second flip-flop 207, and so on throughout the chain of N=127 flip-flops).

In a similar fashion to that described for the first chain 211, each flip-flop 285, 287, ..., 288 of the second directly-connected sequential chain of M flip-flops 212 is clocked at a clock input CK by the generated frequency input 201. The optional prescaler module 241 (similar to or identical to the prescaler module 231) provides a frequency division function between the generated frequency output 225 and the second chain 212 generated frequency input 201 to provide a reduced frequency clocking signal 202. The prescaler module 241 can thus be used to guarantee that the second chain 212 will have sufficient time to reset during the period of the reference clocking frequency, in this case, $f_{127}$. In addition, the prescaler module 241 can provide a frequency division function, such as a divide-by-two function, to scale down a reference frequency $f_{127}$ by half to provide a lower clocking frequency for the flip flops 285, 287, ..., 288 in the second chain 212. Thus, the prescaler module 241 divides the higher frequency down to a usable fraction, as determined by the technology used to fabricate the synthesizer flip-flop chain 212.

In this example, one hundred and twenty-six flip-flops are used in the second chain 212; that is M=N−1=126 in this case where the synthesizer 220 provides the reference frequency output of $(127/128)*f_{ref}$. The numeric reference sequence 285, 287, ..., 288 is used herein to refer to all M=126 flip-flops in the second chain 212. Each flip-flop 285, 287, ..., 288 of the second chain 212 may be a D-type flip-flop, which can be reset using the inverted output Q' 282 from the last flip-flop 288 in the second chain 212. This is typically accomplished by an inverter 227 coupling the inverted output Q' 282 to each of the reset inputs R of the flip-flops 285, 287, ..., 288 in the second chain 212.

Those skilled in the art will realize that it is possible to use more complex circuitry than the simple inverters 217, 227 shown in FIG. 2 to reset the first and second chains 211, 212 at various times during each operational cycle so as to attain even higher operational frequencies for the synthesizer 220. Thus, for example, each flip-flop of the first chain of N flip-flops 211 may be reset sequentially along the length of the chain, such that each flip-flop is reset as soon as a logic HIGH or "1" level has propagated through it. Similarly, as another example, each flip-flop of the second chain 212 of M flip-flops may be reset sequentially (i.e., in a sequential fashion, along the line of the chain 212). Finally, as still another example, an inverted output of a last flip-flop of the first chain 211 may also be used to launch a sequential reset of each flip-flop in the chain 211, using circuitry well known to those skilled in the art.

The first flip-flop 285 of the second chain 212 has a data input D perpetually held at a logic HIGH or "1" level. Each flip-flop 287, ..., 288 of second chain 212 except the first flip-flop 285 (i.e., the second flip-flop 287 through the $126^{th}$ flip-flop 288) has a data input D coupled to the data output Q of an immediately preceding flip-flop in the chain 212 (e.g. the data input D of the second flip-flop 287 is coupled to the data output Q of the first flip-flop 285, the data input D of the third flip-flop (not shown) is coupled to the data output Q of the second flip-flop 287, and so on throughout the chain of M=126 flip-flops).

The number of flip-flops M in the second chain 212 is typically less than the number of flip-flops N in the first chain 211, such that the generated output frequency $f_{127}$ 225 in this case is related to the reference frequency input $f_{ref}$ 210 by a ratio of M+1 divided by N+1, which is 127/128. The generated output frequency ratio results because each flip-flop chain 211, 212 is filled with a logic HIGH value, or "1", from the first flip-flop 205, 285 to the last flip-flop 209, 288. When the logic HIGH value, or "1" reaches the last flip-flop 209, 288 in each chain 211, 212, then each chain 211, 212 is reset completely, and a new cycle of filling each flip-flop in each chain will begin. Since the reset activity for each chain 211, 212 is synchronous, counting 128 cycles (for the first chain 211) in reality means counting from 0 to 127. Similarly, counting 127 cycles (for the second chain 212) means counting from 0 to 126.

Referring back to FIG. 1, it should be noted that while the generated frequencies $f_4 \ldots f_{124}$ are not explicitly shown, the sub-carrier synthesizers for these frequencies are impliedly present in the figure, and are identical to, or similar to the construction described for synthesizers 125, 135, 145, 155, 165, and 175. It should also be noted that each of the sub-carrier synthesizers 125, 135, 145, ..., 155, 165, and 175 is coupled to the common reference frequency $f_{ref}$ input 110. Thus, the sub-carrier synthesizer 140, which generates a frequency related to $f_{ref}$ by the ratio 125/128 has two chains of flip-flops: the first chain has N=127 flip-fops, and the second chain has O=124 flip-flops, since N+1=128, and O+1=125. Similarly, the sub-carrier synthesizer 150 (see FIG. 1), which generates a frequency related to $f_{ref}$ by the ratio 3/128 also has two chains of flip-flops: the first chain has N=127 flip-fops, and the second chain has O=2 flip-flops, since N+1=128, and O+1=3. In more general terms, where O is less than M which is less than N in a multi-channel carrier generator 100, the generated input to the second flip-flop chain in one sub-carrier synthesizer (and the generated output from the sub-carrier synthesizer) is related to the common reference frequency input $f_{ref}$ by a ratio of M+1 divided by N+1. In turn, the generated input to the second flip-flop chain in another sub-carrier frequency synthesizer (as well as the generated output from the other sub-carrier synthesizer) is related to the common reference frequency input $f_{ref}$ by a ratio of O+1 divided by N+1.

The generation of additional sub-carrier frequencies is simply a matter of repeating the design of the sub-carrier synthesizer 220 as described herein, with correspondingly smaller first and second chains of flip-flops. Those skilled in the art will realize that several of the sub-carrier synthesized frequencies can be reduced to lower terms. For example, the frequency ratio 32/128 is the same as ¼, and the number of flip-flops within that particular sub-carrier synthesizer can be reduced accordingly, or even eliminated, by using a simple prescaler module divider circuit operating with a ratio of 1:4. Thus, unnecessary duplication of circuitry can be avoided by using simple prescaler division of previously-synthesized, higher-frequency sub-carriers to generate lower-frequency sub-carriers, such that multiple chains of flip-flops may not be needed to produce each sub-carrier frequency provided by the multi-channel carrier generator 100.

As noted above, the synthesizer 220 includes a duty-cycle recovery circuit 213 that has a first flip-flop 251 with a clock input CK coupled to the clocked output Q 271 of the first sequential chain of N flip-flops 211. The duty-cycle recovery circuit 213 also has a second flip-flop 261 with a clock input CK coupled to the clocked output Q 281 of the second sequential chain of M flip-flops 212. At the end of a reference frequency clocking cycle, the logic HIGH pulses will appear at the clocked outputs 271, 281 of the chains 211, 212, respectively, and, just before both of the chains 211, 212 are reset, the logic HIGH pulses will be in phase. The flip-flops 251, 261, which are typically T-type trigger flip-flops, serve to recover the 50% duty cycle by dividing the input frequency in half. The resulting signals are sent on to the phase detector 266 in the frequency-update module 267. That is, the data output Q of the first flip-flop 251 is coupled to the reference signal input 252 of the frequency-update module 267, and the data output Q of the second flip-flop is coupled to the comparison signal input 253 of the frequency-update module 267. The data input T of the first and second flip-flops 251, 261 is perpetually held at a logic HIGH value.

The frequency-update module 267 receives the output signals from the duty-cycle recovery circuit 213 at the reference signal and comparison signal inputs 252, 253, respectively. The phase detector 266 and charge pump unit 264 act in concert to adjust the output frequency $f_x$ at the output 225 of the VCO 295. It should be noted that the VCO 295 can be replaced by any type of controlled oscillator, including a current-controlled, or charge-controlled oscillator. It should also be noted that increasing the amount of division effected by the prescaler modules 231, 241, and/or increasing the number of flip-flops used in the chains 211, 212 may diminish the rate at which the VCO 295 output $f_{127}$ 225 is updated, which in turn may affect the overall dynamics of phase-locking with respect to sub-carrier generation.

The current pump 264 and phase detector 266 of the frequency-update module 267 typically require a low-pass filter with a very low cutoff frequency (e.g, in the range of about one or two Hertz to a few tens of kiloHertz) to properly control the output of the VCO 295. Since the magnitude of the signals presented to the reference signal and comparison signal inputs 252, 253 of the frequency-update module 267 is often quite large (e.g., rail-to-rail), a compact two-stage filtering mechanism may be constructed to process these signals effectively. The first filter 263 may be constructed using any of several well-known PLL low-pass loop filter topology designs, but less area may be required, since some embodiments can operate at higher frequencies.

Figure 3:
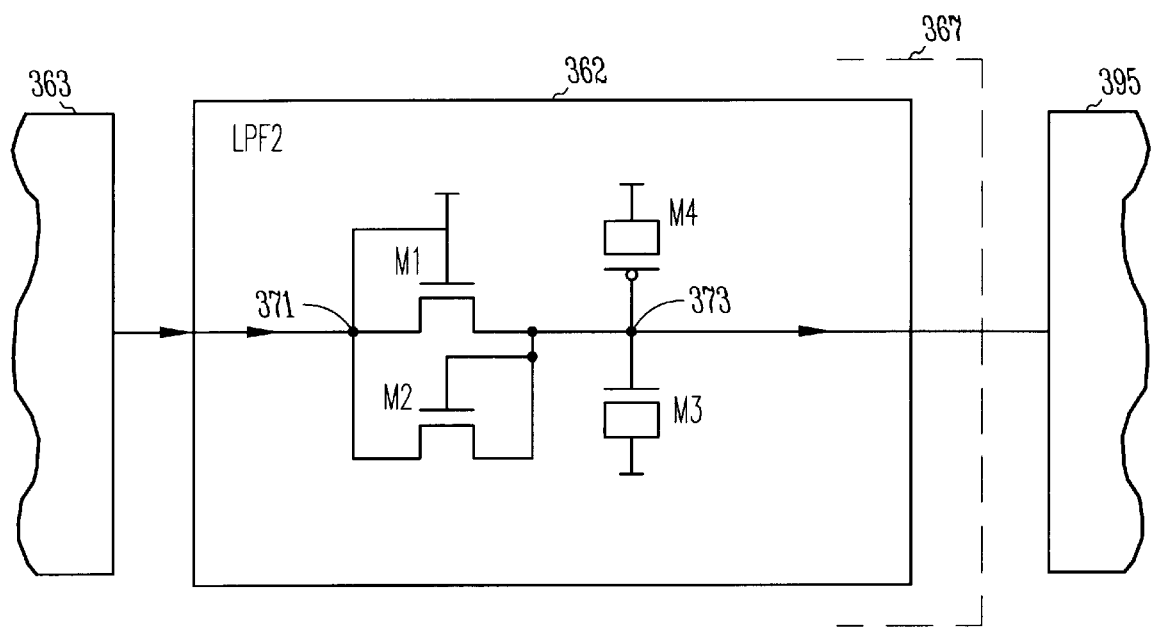
FIG. 3 is schematic block diagram of a low-pass filter circuit used in the sub-carrier frequency synthesizer of FIG. 2, according to various embodiments.

After processing by the first low-pass filter 263, the signal is sent to a second, sub-threshold, low-pass filter as shown in FIG. 3, which is a schematic block diagram of a low-pass filter circuit used in the sub-carrier frequency synthesizer of FIG. 2. The sub-threshold low-pass filter 362 is an element of the frequency-update module 367, and typically disposed between the first low-pass filter 363 and the VCO 395. The filter 362 includes a first pair of transistors M1, M2 connected in parallel, and a second pair of transistors M3, M4 coupled to the first pair of transistors M1, M2 at a single junction 373 so as to provide a symmetric charge source and sink. Typically, the first and second pairs of transistors M1, M2, M3, M4 are metal-oxide semiconductor transistors.

Transistors M1 and M2, due to the action of the first low-pass filter 363, will see only sub-threshold currents flowing from source to drain. The gate of transistor M1 is connected to the node 371, and the gate of transistor M2 is connected to the node 373, such that charge is symmetrically sourced and sunk at the node 373. Therefore, the source and drain terminals of the transistors M1 and M2 will switch according which of the nodes 371, 373 develops a higher voltage.

Transistors M3, M4 have source and drain terminals tied together so as to operate as capacitors. Since the transistors M1 and M2 operate in the sub-threshold region, very high resistance is provided without a correspondingly long channel length. Typical resistance-capacitance (RC) time constants for the second low pass filter 362, with a total surface area of 20 microns$^2$ may be as long as 1 millisecond, or even longer.

Thus, the low-pass frequency cutoff of the pre-filter 263 should be just sufficient to reduce the magnitude of the signal emerging from the current pump to the sub-threshold voltage level, which means the characteristic $V_T$ of the transistors M1–M4, or about 0.1 V to about 0.4 V, depending on the transistor process and gate length for transistor pairs M1, M2, M3, M4. This two-stage filtering process allows the size of the components used in the pre-filter 363 to be reduced significantly, since the operational cutoff frequency of the filter 363 will be significantly higher than what is ordinarily required if all filtering were accomplished using a single filter stage.

Figure 4:
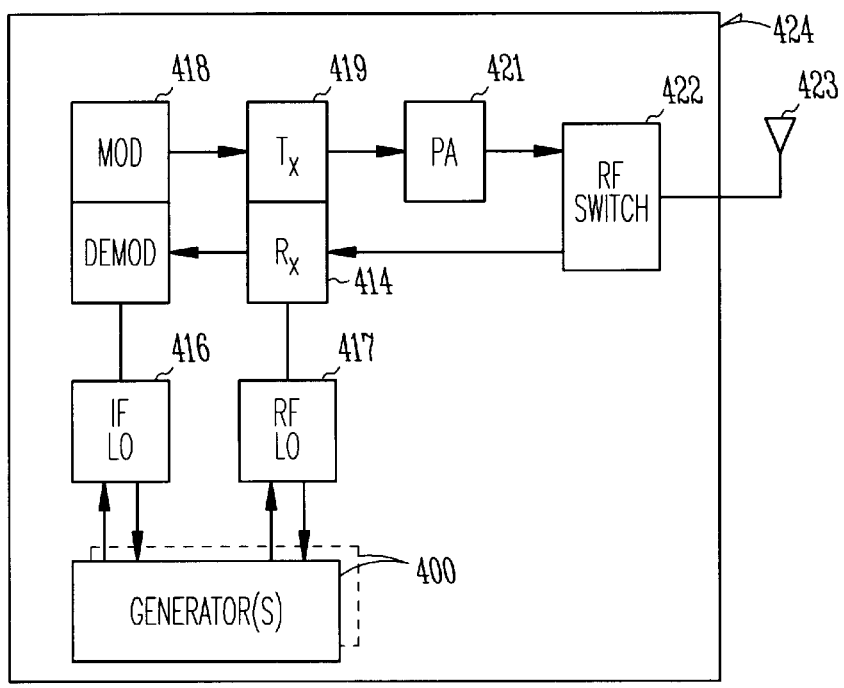
FIG. 4 is schematic block diagram of a transceiver according to various embodiments.

FIG. 4 is a schematic block diagram of a transceiver constructed according to various embodiments. Those skilled in the art will realize that a transceiver, transmitter, and/or receiver may all be constructed using many different arrangements of modules similar to, or identical to, those shown in FIG. 4. Further, the modules and concept disclosed can be used to transmit data using a wireless medium, or a wireline connection. Thus, the transceiver 424 should be understood by way of example, and not of limitation.

The transceiver 424, which may be a 900 MHz cellular telephone, for example, includes an antenna 423 which is coupled to a radio frequency switch 422, such as a duplexer, which is in turn coupled to a power amplifier 421 and a receiver/transmitter 414, 419, which may be a combination, coupled together, or separate units.

One or more multi-channel carrier generators 400, constructed according to various embodiments, may be coupled to the receiver 414 and transmitter 419 by way of a radio frequency local oscillator 417. Similarly, one or more multi-channel carrier generators 400 may be coupled to a modulator/demodulator 418 (which is in turn coupled to the receiver and transmitter 414, 419), by an intermediate frequency local oscillator 416. The generator(s) 400 include a plurality of sub-carrier synthesizers similar to or identical to the sub-carrier synthesizer 220 shown in FIG. 2. The number of flip-flops in the various chains of each synthesizer are in accordance with the ratios described above, to support multiple-channel operation.

For the two sub-carrier synthesizers used in a two-channel transceiver, the number of flip-flops in the second chain of the second synthesizer O is less than the number of flip-flops in the second chain of the first synthesizer M, which is in turn less than the number of flip-flops in the first chains of the first and second sub-carrier synthesizers N. The generated input (and generated output) of the first sub-carrier frequency synthesizer will therefore be related to the common reference frequency input by a ratio of (M+1)/(N+1), and the generated input (and generated output) of the second sub-carrier frequency synthesizer will be related to the common reference frequency input by a ratio of (O+1)/(N+1).

One of ordinary skill in the art will understand that the communications circuitry of various embodiments can be used in applications other than for multi-channel carrier generators and transceivers, and thus, such embodiments are not to be so limited. The illustrations of a multi-channel carrier generator 100, sub-carrier frequency synthesizer 220, and transceiver 424 in FIGS. 1, 2 and 4 are intended to provide a general understanding of the structure and circuitry of various embodiments, and are not intended to serve as a complete description of all the elements and features of communications circuitry or computer systems which might make use of the novel sub-threshold low-pass filter and sub-carrier generation circuitry and structures described herein.

Applications which may include the novel communications circuitry disclosed herein include electronic circuitry used in high-speed computers, device drivers, power modules, communication circuitry, modems, processor modules, embedded processors, and application-specific modules, including multilayer, multi-chip modules. Such circuitry may further be included as sub-components within a variety of electronic systems, such as televisions, cellular telephones, personal computers, personal radios, aircraft, and others.

Figure 5:
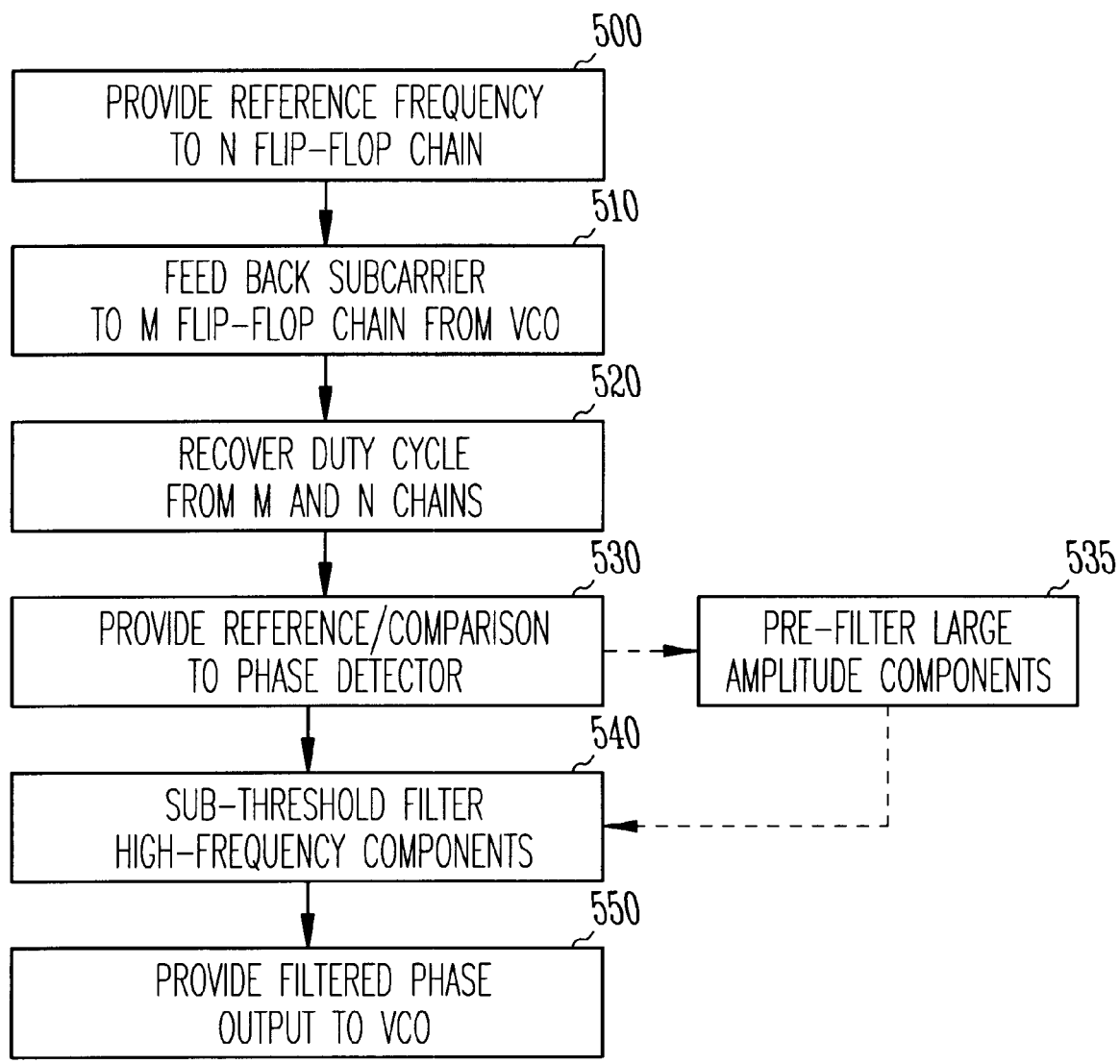
FIG. 5 is a flow chart of a method for generating a sub-carrier frequency according to various embodiments.

FIG. 5 is a flow chart of a method for generating a sub-carrier frequency according to various embodiments. The method begins in block 500 with providing a reference frequency to the reference frequency input of a first directly-connected sequential chain of N flip-flops. Block 510 feeds back the sub-carrier frequency from a voltage controlled oscillator to a second directly-connected sequential chain of M flip-flops. Block 520 recovers the duty cycle from a clocked output of the first and second directly-connected sequential chains of flip-flops as a reference signal input and a comparison signal input, respectively.

Block 530 provides the reference and comparison signal inputs to a phase detector to produce a phase output including high-frequency signal components. If the reference and comparison signal inputs are presented as signals of a relatively large magnitude, the method may include pre-filtering, that is, removing one or more large amplitude components of the phase output, so as to reduce the amplitude of the phase output to the sub-threshold level in block 535.

Block 540 filters out some portion of the high frequency signal components from the phase output using a sub-threshold low-pass filter to produce a filtered phase output. Block 550 provides the filtered phase output to the voltage controlled oscillator. According to some embodiments, the sub-carrier frequency is related to the reference frequency by a ratio of M+1 divided by N+1, and sub-threshold, low-pass filtration will be conducted as described above.

As mentioned above, it should be noted that the circuitry and methods described herein are applicable to both wireless and wired communications media. For example, in an embodiment where data channel transmission rates between a transmitting system and a receiving system approach or exceed several gigabits/second, and cabling or board-to-board connectors are used to send the data from one system to the other, various notch frequencies may arise within the preferred communication channel bandwidth due to irregularities in electrical circuit traces, and/or the natural filtering which occurs due to the physical size and location of various circuit components. Of course, those skilled in the art will realize that many other factors may also create such notches in the transmission channel bandwidth. In this case, where the notches serve to disrupt single-channel communication in the allotted bandwidth, a multi-channel approach may be used to send data at generated frequencies which do not coincide with the notches. Thus, for example, a multi-channel carrier generator constructed according to various embodiments can be used to generate any number of high-frequency carriers, one or more of which are at frequencies other than the notch frequencies. These carriers can then be modulated with the data to be sent over the original channel (using one or more smaller-bandwidth channels), avoiding the notches, and allowing uninterrupted transmission of the data to occur.

Thus, various embodiments may provide novel sub-carrier frequency synthesizer circuitry, multi-channel carrier generators, and transceivers. Some embodiments also includes a method to generate a sub-carrier frequency. Some embodiments may also obviate the need for large area, power-hungry loop filters used in conventional PLLs, and serves the needs of communications circuit engineers searching for high-speed, scalable, and robust circuit designs.

Although specific embodiments have been illustrated and described herein, it should be appreciated that any arrangement calculated to achieve the same purpose may be substituted for the specific embodiments shown. This disclosure is intended to cover any and all adaptations or variations of various embodiments of the invention. It is to be understood that the above description has been made in an illustrative fashion, and not a restrictive one. Combinations of the above embodiments, and other embodiments not specifically described herein, will be apparent to those of skill in the art upon reviewing the above description.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. An apparatus, comprising:
   a frequency-update module including a sub-threshold low-pass filter, a reference signal input coupled to a first chain of flip-flops, and a comparison signal input coupled to a second chain of flip-flops; and
   an oscillator coupled to the sub-threshold low-pass filter.

2. The apparatus of claim 1, wherein each flip-flop of the first chain of flip-flops is clocked by a reference frequency input.

3. The apparatus of claim 1, wherein each flip-flop included in the first chain of flip-flops is reset by an inverted output of a selected flip-flop included in the first chain of flip-flops.

4. The apparatus of claim 1, wherein each flip-flop included in the first chain of flip-flops is reset sequentially.

5. The apparatus of claim 1, wherein each flip-flop included in the first chain of flip-flops except a first flip-flop included in the first chain of flip-flops has a data input coupled to a data output of an immediately preceding flip-flop of the first chain of flip-flops, and wherein a last flip-flop of the first chain of flip-flops has an inverted output coupled to a reset input of each flip-flop of the first chain of flip-flops.

6. The apparatus of claim 5, wherein the inverted output of the last flip-flop of the first chain of flip-flops is coupled to the reset input of each flip-flop of the first chain of flip-flops using an inverter.

7. The apparatus of claim 1, wherein an inverted output of a last flip-flop of the first chain of flip-flops is used to launch a sequential reset of each flip-flop of the first chain of N flip-flops.

8. The apparatus of claim 1, wherein each flip-flop of the second chain of flip-flops is clocked by a generated frequency input.

9. The apparatus of claim 1, wherein each flip-flop of the second chain of flip-flops is reset by an inverted output of a selected flip-flop of the second chain of flip-flops.

10. The apparatus of claim 1, wherein each flip-flop of the second chain of flip-flops is reset sequentially.

11. The apparatus of claim 1, wherein each flip-flop of the second chain of flip-flops except a first flip-flop of the second chain of flip-flops has a data input coupled to a data output of an immediately preceding flip-flop of the second chain of flip-flops, and wherein a last flip-flop of the second chain of flip-flops has an inverted output coupled to a reset input of each flip-flop of the second chain of flip-flops.

12. The apparatus of claim 11, further including:
   a duty-cycle recovery circuit to couple a clocked output of the first chain of flip-flops and a clocked output of the second chain of flip-flops to the reference signal input and the comparison signal input.

13. The apparatus of claim 12, wherein the duty-cycle recovery circuit includes:
   a first flip-flop coupled to the clocked output of the first chain of flip-flops and the reference signal input; and a second flip-flop coupled to the clocked output of the second chain of flip-flops and the comparison signal input.

14. The apparatus of claim 13, wherein a clock input of the first flip-flop is coupled to the clocked output of the first chain of flip-flops, wherein a data output of the first flip-flop is coupled to the reference signal input, wherein a clock input of the second flip-flop is coupled to the clocked output of the second chain of flip-flops, and wherein a data output of the second flip-flop is coupled to the comparison signal input.

15. The apparatus of claim 1, wherein a second number of flip-flops included in the second chain of flip-flops is less than a first number of flip-flops included in the first chain of flip-flops.

16. The apparatus of claim 1, wherein the generated output is related to the reference frequency input by a ratio of the second number plus one divided by the first number plus one.

17. The apparatus of claim 1, wherein the sub-threshold low-pass filter includes:
a first pair of transistors connected in parallel; and
a second pair of transistors coupled to the first pair of transistors at a single junction to provide a symmetric charge source and sink.

18. The apparatus of claim 17, wherein the first and second pair of transistors are metal-oxide semiconductor transistors, and wherein a source of one of the first pair of transistors is connected to a drain of another one of the first pair of transistors to form a junction connected to a gate of each one of the second pair of transistors.

19. A generator, comprising:
a first apparatus having a common reference frequency input, comprising:
a frequency-update module having a first sub-threshold low-pass filter, a reference signal input coupled to a clocked output of a first chain of flip-flops coupled to the common reference frequency input, and a comparison signal input coupled to a clocked output of a second chain of flip-flops coupled to a first generated frequency input; and
an oscillator coupled to the first sub-threshold low-pass filter and the first generated frequency input; and
a second apparatus coupled to the common reference frequency input, comprising:
a frequency-update module having a second sub-threshold low-pass filter, a reference signal input coupled to a clocked output of a first chain of flip-flops coupled to the common reference frequency input, and a comparison signal input coupled to a clocked output of a second chain of flip-flops coupled to a second generated frequency input; and
an oscillator coupled to the second sub-threshold low-pass filter and the second generated frequency input.

20. The generator of claim 19, wherein a number of flip-flops included in the second chain of flip-flops in the second apparatus is less than a number of flip-flops included in the second chain of flip-flops in the first apparatus, and wherein the number of flip-flops included in the second chain of flip-flops in the first apparatus is less than a number of flip-flops included in the first chain of flip-flops in the first apparatus.

21. The generator of claim 20, wherein the generated frequency input of the first apparatus is related to the common reference frequency input by a ratio of M+1 divided by N+1, and wherein the generated frequency input of the second apparatus is related to the common reference frequency input by a ratio of O+1 divided by N+1.

22. The generator of claim 20, wherein the first chain of flip-flops of the first apparatus is coupled to the common reference frequency input using a first prescaler module.

23. The generator of claim 22, wherein the second chain of flip-flops of the first apparatus is coupled to the first generated frequency input using a second prescaler module.

24. A transceiver, comprising:
a transmitter;
a receiver; and
a generator coupled to the transmitter and the receiver, comprising:
a first apparatus having a common reference frequency input, comprising:
a frequency-update module having a first sub-threshold low-pass filter, a reference signal input coupled to a clocked output of a first chain of flip-flops coupled to the common reference frequency input, and a comparison signal input coupled to a clocked output of a second chain of flip-flops coupled to a first generated frequency input; and
an oscillator coupled to the first sub-threshold low-pass filter and the first generated frequency input; and
a second apparatus coupled to the common reference frequency input, comprising:
a frequency-update module having a second sub-threshold low-pass filter, a reference signal input coupled to a clocked output of a first chain of flip-flops coupled to the common reference frequency input, and a comparison signal input coupled to a clocked output of a second chain of flip-flops coupled to a second generated frequency input; and
an oscillator coupled to the second sub-threshold low-pass filter and the second generated frequency input.

25. The transceiver of claim 24, wherein a number of flip-flops included in the second chain of flip-flops in the second apparatus is less than a number of flip-flops included in the second chain of flip-flops in the first apparatus, and wherein the number of flip-flops included in the second chain of flip-flops in the first apparatus is less than a number of flip-flops included in the first chain of flip-flops in the first apparatus.

26. The transceiver of claim 25, wherein the generated frequency input of the first apparatus is related to the common reference frequency input by a ratio of M+1 divided by N+1, and wherein the generated frequency input of the second apparatus is related to the common reference frequency input by a ratio of O+1 divided by N+1.

27. A method of generating a sub-carrier frequency, comprising:
providing a reference frequency to a reference frequency input of a first chain of flip-flops;
feeding back a sub-carrier frequency from an oscillator to a second chain of flip-flops;

providing a clocked output of the first chain of flip-flops as a reference signal input to a phase detector, and a clocked output of the second chain of flip-flops as a comparison signal input to the phase detector to produce a phase output including high-frequency signal components;

filtering out some portion of the high frequency signal components from the phase output using a sub-threshold low-pass filter to produce a filtered phase output; and providing the filtered phase output to the oscillator.

28. The method of claim 27, wherein the sub-carrier frequency is related to the reference frequency by a ratio of M+1 divided by N+1.

29. The method of claim 27, further including:

pre-filtering a large amplitude component of the phase output.

* * * * *